(12) United States Patent
Mattson

(10) Patent No.: US 7,782,047 B2
(45) Date of Patent: Aug. 24, 2010

(54) DUAL AXIS MAGNETIC FIELD DETECTOR AND MAGNETS THEREFOR

(75) Inventor: Daniel J. Mattson, Pleasant Prairie, WI (US)

(73) Assignee: ZF Friedrichshafen AG, Friedrichshafen (DE)

( * ) Notice: Subject to any disclaimer, the term of this patent is extended or adjusted under 35 U.S.C. 154(b) by 763 days.

(21) Appl. No.: 11/788,340

(22) Filed: Apr. 19, 2007

(65) Prior Publication Data

US 2008/0174301 A1   Jul. 24, 2008

Related U.S. Application Data

(60) Provisional application No. 60/793,833, filed on Apr. 21, 2006.

(51) Int. Cl.
*G01B 7/14*  (2006.01)
*G01B 7/30*  (2006.01)

(52) U.S. Cl. .................................... 324/207.23
(58) Field of Classification Search ............. 324/207.23
See application file for complete search history.

(56) References Cited

U.S. PATENT DOCUMENTS

| | | | |
|---|---|---|---|
| 4,100,480 A * | 7/1978 | Lytle et al. ............. | 340/870.35 |
| 4,392,375 A | 7/1983 | Eguchi et al. | |
| 4,489,274 A | 12/1984 | Berlincourt | |
| 4,737,410 A | 4/1988 | Kantner | |
| 5,055,781 A | 10/1991 | Sakakibara et al. | |
| 5,861,747 A | 1/1999 | Kubinski | |
| 5,885,185 A | 3/1999 | Kidokoro et al. | |
| 6,057,682 A * | 5/2000 | McCurley et al. ...... | 324/207.23 |
| 6,137,288 A | 10/2000 | Luetzow | |
| 6,175,233 B1 * | 1/2001 | McCurley et al. ........ | 324/207.2 |
| 6,489,761 B1 | 12/2002 | Schroeder et al. | |
| 6,501,265 B2 | 12/2002 | Nakamura et al. | |
| 6,556,005 B1 * | 4/2003 | Oomkes .................. | 324/207.2 |
| 6,724,185 B2 | 4/2004 | Ooki et al. | |
| 7,449,878 B2 * | 11/2008 | Lee ........................ | 324/207.23 |
| 2009/0302832 A1 * | 12/2009 | Budde et al. ........... | 324/207.24 |

* cited by examiner

*Primary Examiner*—Jay M Patidar
(74) *Attorney, Agent, or Firm*—David W. Okey

(57) ABSTRACT

A dual axis magnetic field detector is able to detect the presence of a magnetic field in two axes, such as a rotary axis and a linear axis. The detector includes a magnet for generating a magnetic field and two magnetic field sensors for detecting the strength and angle of the magnetic field as the magnet moves. The sensors may detect the axial and rotary displacement of an object, such as a shaft, to which the magnet is affixed.

20 Claims, 6 Drawing Sheets

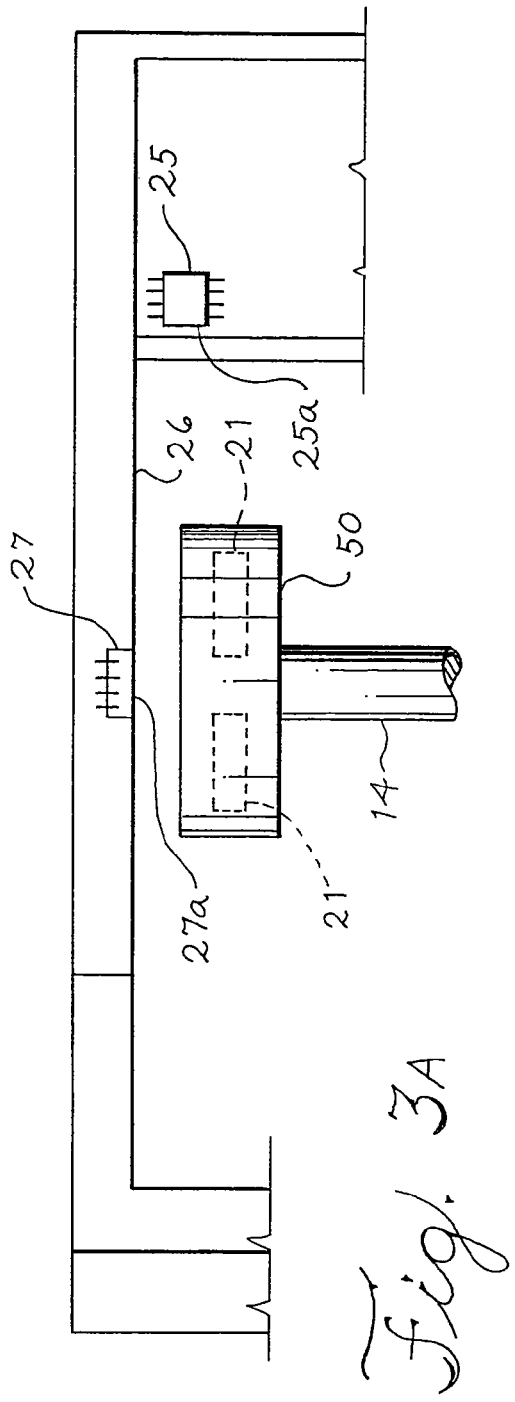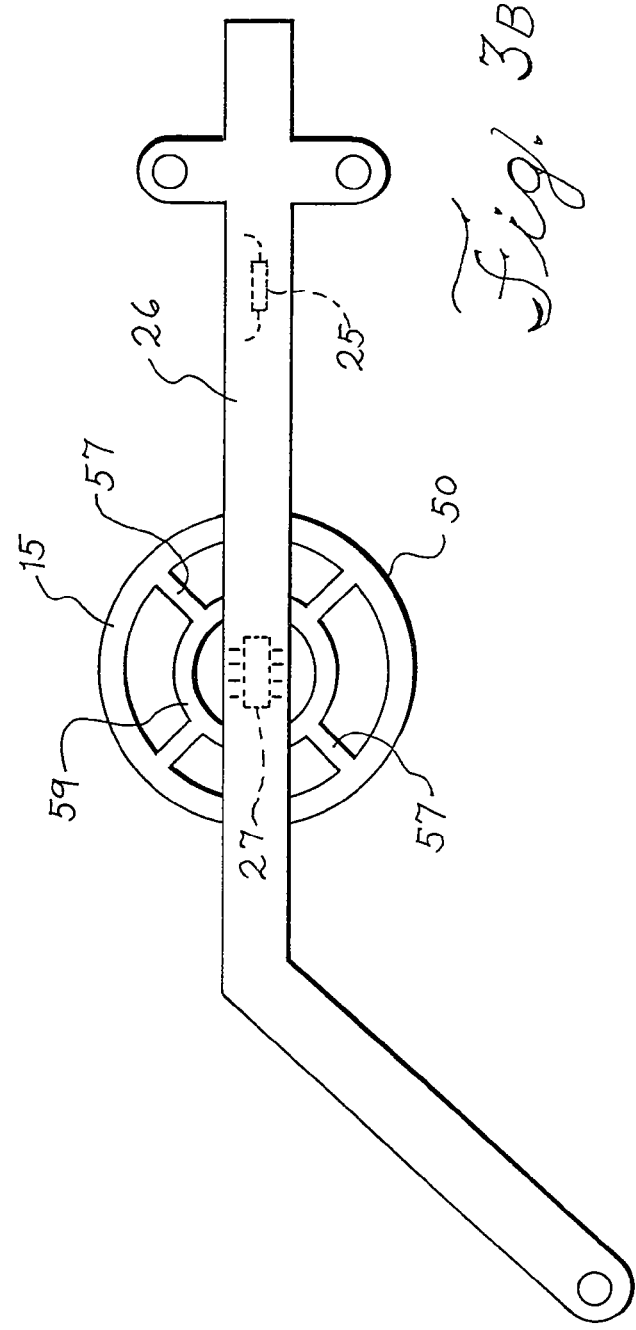

DUAL AXIS MAGNETIC FIELD DETECTOR AND MAGNETS THEREFOR

CROSS REFERENCE TO RELATED APPLICATION

This non-provisional patent application is related to and claims the benefit of the filing date of prior co-pending provisional application Ser. No. 60/793,833 filed Apr. 21, 2006.

BACKGROUND

1. Field of the Invention

The field of the invention is that of sensors for detecting the position of an object in two axes, such as a linear axis and a rotary axis.

2. Background Art

Sensors and devices for detecting the position of an object in a single axis are well known. For instance, a linear variable differential transformer (LVDT) can accurately detect the position of an object along a linear axis. In a similar manner, a rotary encoder can quickly and accurately detect the rotational position of a rotating device, such as a motor shaft. In another example, a plurality of hall-effect sensors may be used with a magnet to determine the rotary position of a nearby rotating shaft or wheel, as disclosed in U.S. Pat. No. 4,737,710.

Instead of hall-effect sensors, magnetoresistive elements may be used, as outlined in U.S. Pat. No. 5,055,781. A magnetoresistive element is an element whose electrical resistance varies in a predictable way when subjected to a magnetic field. Examples are ferromagnetic alloys, such as Ni—Co on a substrate. Additional examples are given in U.S. Pat. No. 5,861,747, which discloses multi-layer magnetoresistive elements, such as multilayered Cu/Co.

However, considerable difficulties emerge if it is desired to detect the position of an object in more than one dimension or axis. For instance, superconducting quantum interference devices (SQUIDs) may be used to detect magnetic fields or their movement in more than one axis by using more than one SQUID, as outlined in U.S. Pat. No. 4,489,274. A disadvantage of such detectors is that they require cryogenic temperatures down to 4 K, which severely restricts applications for which such detectors are used.

In the field of toroidal-type continuously-variable transmissions, such as for automotive use or for an on- or off-road vehicle, the axial and rotational position of trunnions of the transmission determines the ratio of input speed to output speed, as shown in U.S. Pat. No. 5,885,185. It is known to determine the position of the trunnions by using a control mechanism with a stepping motor and a sleeve and spool that drives the trunnions and associated rollers to their desired positions. The linear position of the trunnions may be estimated by a linear-axis displacement unit. Alternatively, the position of the trunnions may be estimated by using a linear axis displacement sensor. Angular position may be determined by a rotation sensor. While this apparatus can determine approximate positions, it would be desirable to provide an improved method and apparatus for detecting the axial and rotational positions of trunnions with greater accuracy and in a single package.

BRIEF SUMMARY

One aspect of the invention is a dual position detector. The detector includes a housing and first and second sensors which can sense a magnetic field. The sensors are attached to the housing and at least one magnet is attached to a movable object, wherein the first and second magnetic sensors are oriented to detect the motion of the magnet for linear and rotary axes of motion and thereby determine positions in two different orientations.

Another aspect of the invention concerns a dual position detector of the above-described type, wherein at least one of the sensors includes a ferromagnetic disc and wherein the components operate to detect angular and axial positions with substantial accuracy. It should be understood that a ferromagnetic disc is not strictly required for this application, as angular sensing can be achieved without using this disc.

Another aspect of the invention is a method for detecting movement of a magnet in two axes using a dual axis magnetic field detector. The method includes mounting a magnet on a movable object, mounting on a housing a first sensor and a second sensor apart from the first sensor for sensing a magnetic field from the magnet, orienting the sensors or the magnet such that the magnetic field is parallel to a sensing face of at least the first or second sensor, and detecting movement of the magnet with the first and second sensors, such that the first sensor detects movement of the magnet along a linear axis, and the second sensor detects movement of the magnet along a rotary axis.

Yet another aspect of the invention is a method for detecting movement of a first magnet in two axes and a second magnet in two axes, using the method described above. The method also includes reporting movements of the magnets to a controller. The controller can then use this feedback from the sensors for further adjustment of the system and the magnets as necessary. There are many aspects and embodiments of the invention, of which several are described below.

BRIEF DESCRIPTION OF THE DRAWINGS

FIG. 3a is a diagrammatic side view of a sensing mount, magnetic sensors and associated trunnion for the transmission of FIG. 1.

FIG. 3b is a diagrammatic top view of the elements of FIG. 3a.

DETAILED DESCRIPTION OF THE DRAWINGS AND THE PRESENTLY PREFERRED EMBODIMENTS

A dual axis magnetic field detector as described below is useful for determining the position of a magnet in two axes, such as a distance along a linear axis or an angle with respect to a rotary axis. Sensors may thus be used to determine a displacement along one axis and a rotation in another axis. In other applications, a dual axis detector may be used in determining two linear axes or two rotary axes simultaneously. The dual axis detector includes two sensors for detecting a magnetic field, such as a hall-effect sensor or a magneto-restrictive sensor. One of the two sensors is used to determine the position of the magnet in one axis, and the other sensor is used to determine the position of the magnet in another, preferably perpendicular axis. The two sensors are preferably separate and spaced apart from each other.

Figure 1:
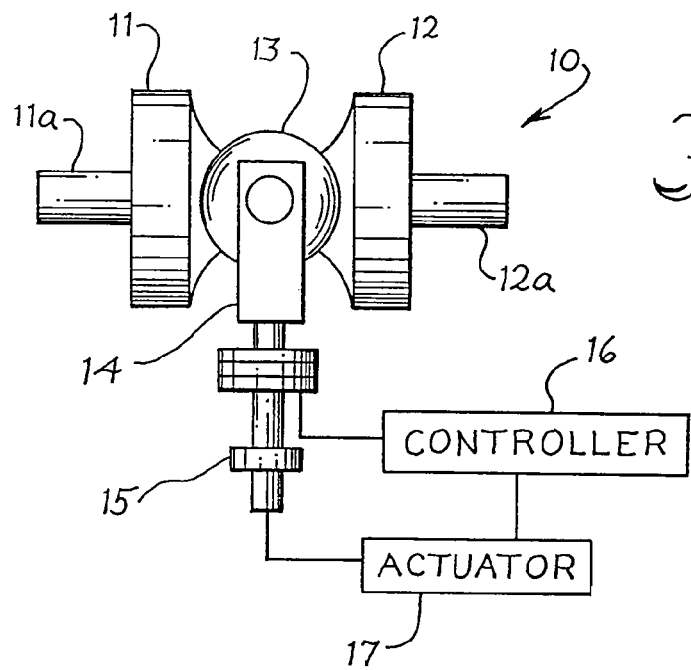
FIG. 1 is a side view of a continuously variable transmission.

One application for a dual axis magnetic field sensor is in a continuously variable hydraulic transmission, such as shown in U.S. Pat. No. 5,885,185. FIG. 1 depicts a toroidal continuously variable transmission 10. The transmission includes an input shaft 11a and an output shaft 12a. The input shaft 11a is connected to an input toroid 11, while the output shaft 12a is connected to an output toroid 12. Toroids 11, 12 are connected by a pair of rollers 13. Only one of the rollers is shown in the figure, the other roller being on the other side of the roller and toroids shown in FIG. 1. The position of the rollers 13 is adjusted by at least one trunnion 14 and a piston 15, which may be a hydraulic piston.

In one control scheme, the position of the trunnion and the piston are controlled by a controller 16 and an actuator 17. An example of a controller is a microprocessor controller. An example of an actuator is a hydraulic pump controlled by a valve that is under the supervision of the microprocessor. The position of rollers 13 may be varied by translating piston 15 up or down in a vertical axis as shown. The position of the rollers, and the performance of the transmission, may also be adjusted by allowing the rollers to rotate with respect to toroids 11, 12, as a result of their up/down positions. This is more easily seen in FIGS. 5-7 which illustrate various positions of the components of a transmission.

Figure 2:
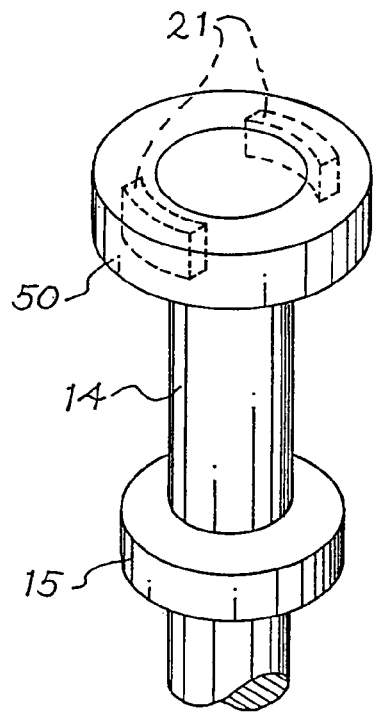
FIG. 2 is a perspective view of a trunnion, piston and associated sector magnets of the transmission of FIG. 1.

The trunnion 14 may support one or more magnets on a magnet carrier 50, for example as shown in FIGS. 2 and 3a. For example, the carrier 50 may mount sector magnets 21 as shown in FIG. 2. As shown in FIGS. 3a and 3b, sensors 25, 27 are used to detect the magnetic field of the sector magnets 21, from mounted positions on a stationary support 26. The sensor 25 is mounted with its sensing face 25a in a vertical plane, which is preferable for sensing displacement of the magnets in a vertical axis. The sensor 27 is mounted with its sensing face 27a in a horizontal plane. This orientation is preferable for detecting rotation of the sector magnets in a horizontal plane.

If sector magnets 21 are used, as shown in FIG. 2, the sector magnets will preferably be aligned with their top surfaces in a plane, and with their bottom surfaces also aligned in a plane. In this orientation, the magnetic field generated by the sector magnets will also preferably be relatively planar and parallel to the top and bottom surfaces of the magnet and above and below and normally outside the surfaces of the magnets. Ring magnets could be aligned in the same way. Experimental work on the dual sensor detector has shown that it works best with a magnetic field that is parallel with one sensor and perpendicular to the other sensor. Other orientations, however, may also be used.

Detection of the magnets is easier if the magnets are aligned in the direction in which movement is anticipated, or transverse to the direction in which movement is anticipated. Thus, detection of vertical or z-axis movement of the magnets is easier if the magnets are horizontally aligned. In a similar manner, if the magnets, or the trunnions on which the magnets are mounted, rotate in a horizontal plane, it is also easier to detect the position of the magnets.

Figure 4A:
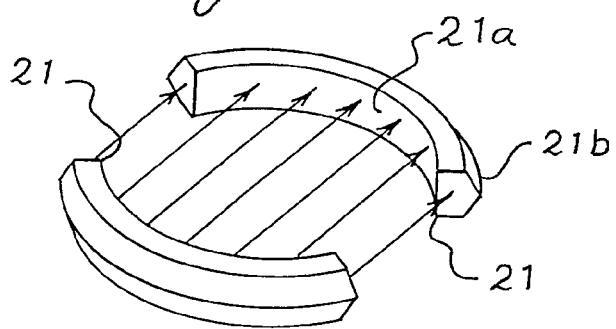
FIG. 4a is a diagrammatic view of sector magnets used in the transmission of FIGS. 1, 2, 3a and 3b, with curved magnetic lines of force illustrated as straight lines to show an approximate effective magnetic field.
Figure 4B:
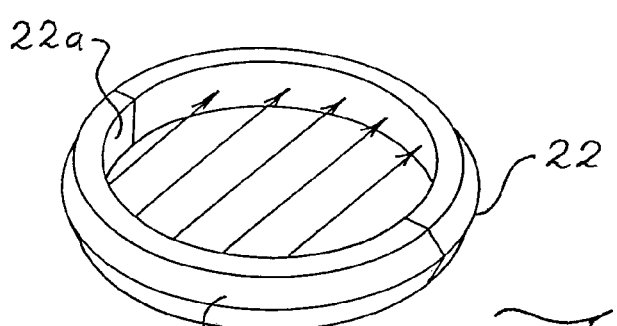
FIG. 4b is a diagrammatic view of ring-forming magnets used in the transmission of FIGS. 1, 2, 3a and 3b, with curved magnetic lines of force illustrated as straight lines to show an approximate effective magnetic field.

Magnets that are suitable for this application are shown in FIGS. 4a and 4b. A monolithic ring magnet, such as cylindrical magnet 22 may be used, or as seen above, magnet sectors, such as 90° sectors 21, may be used. The magnet sectors 21 and cylindrical magnet 22 preferably have a smooth inside bore 21a, 22a, and a shaped and oriented outer area 21b, 22b. In the embodiments shown, the outer profile of the magnets or magnet sectors extends at a bevel angle of from about 30° to about 60°, although other angles may be used. It is believed that the bevel helps to spread the magnetic field outside the magnets to accentuate the changes in the angle of the fields detected by the sensors. In other embodiments, the magnets may be hollow cylindrical magnets without an angular, circumferential extension, or they may be solid cylindrical magnets.

These geometries also help to concentrate the magnetic field inside the magnet or magnets, thus also facilitating measurements of the magnetic field. This concentration also helps in detecting the angle, and thus the position of the magnet with respect to the sensor, for both in-plane (rotary) and out-of-plane (displacement) measurements. To detect the magnetic field, and thus the position of the magnet, hall-effect sensors have been used, such as Sentron's 2SA-10. An interface chip may be used to compute the angle from the sensor data, and report that angle. Alternatively, a Melexis integrated circuit, such as the MLX90316, which includes a sensor and an interface, may be used. The Sentron 2SA-10 sensor includes internal hall-effect elements and a thin ferromagnetic disc that concentrates the external magnetic field. This sensor is particularly well-adapted to detecting the angle of a nearby magnetic field. The Melexis MLX90316 system includes hall elements, a thin ferromagnetic disc, and a programmable integrated circuit. The circuit may be programmed to adjust the detector output to a desired range. Sentron chips are made by Sentron AG, Zug, Switzerland. Melexis chips are available through Melexis Microelectronics Systems, Ieper, Belgium. Suitable magnetoresistive sensors, which can resolve the magnetic field into x and y components, are available from other manufacturers, such as HL Planar-Technik GmbH, Dortmund, Germany.

The field within the magnets is preferably as directionally uniform as possible, and the field outside the magnets is preferably uniformly divergent. In displacement testing conducted to date, in z-axis results for sector magnets, the field directional variance was seen to vary up to about 29%, and deviation from uniform divergence was less than ±3%. In tests for rotational performance, field direction was more uniform, with a variance of only about 0.5% for sector magnets.

Figure 5:
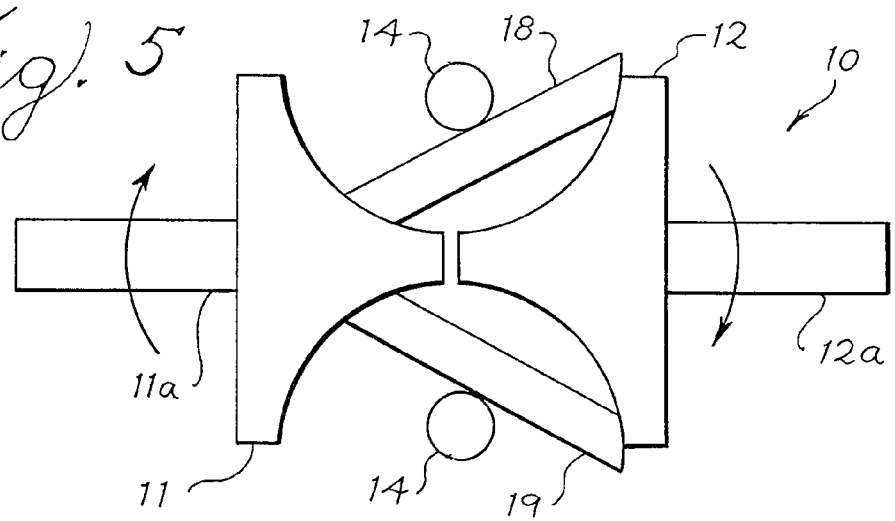
FIGS. 5-7 show top views of selected components of a transmission in various operational positions.
Figure 6:
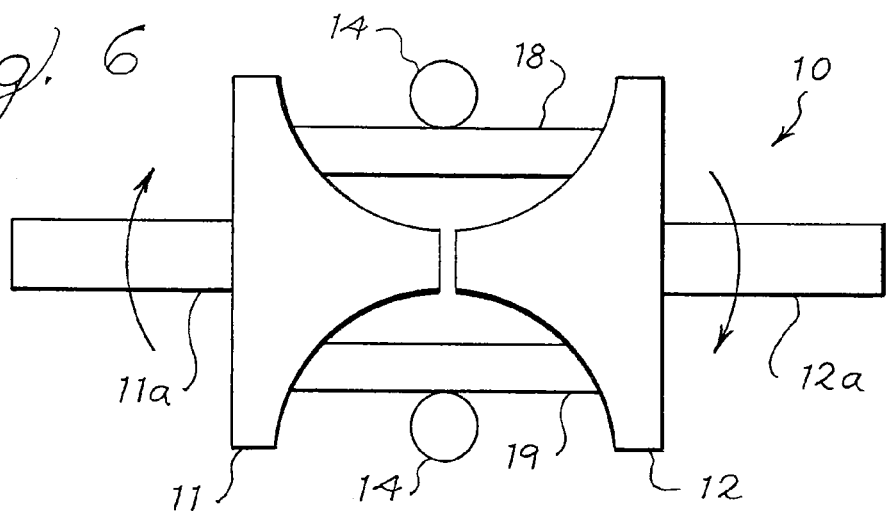
Figure 7:
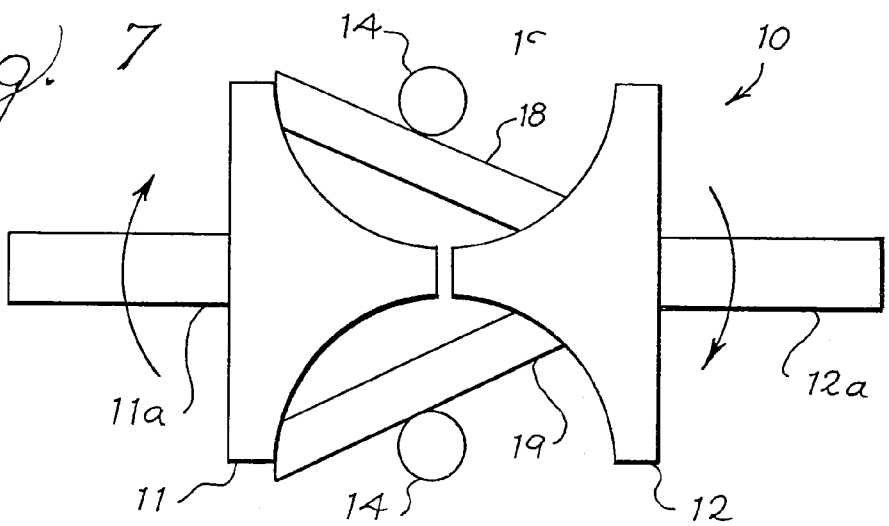

The dual axis magnetic field sensor is preferably used in toroidal continuously variable transmissions, as shown in FIGS. 5-7, which show top schematic views of the transmission in operation. In FIG. 5, the transmission is in low gear. The positions of rollers 18, 19 are adjusted through trunnions 14. The input toroid 11 with input shaft 11a contacts the rollers 18, 19 at a relatively small diameter of the input toroid. The same rollers 18, 19, contact the output toroid 12 with output shaft 12a at a relatively large diameter. Thus, it may require several revolutions of the input toroid 11 to cause one revolution of the output toroid 12. This would be considered a low gearing ratio, or a low gear for the transmission, suitable for start-up, heavy loads, or loads requiring high torque.

In FIG. 6, the trunnions 14 have adjusted the positions of rollers 18, 19 to an intermediate position, in which the input toroid 11 will revolve about 1 revolution per output revolution of output toroid 12. This position of the rollers may be considered an intermediate gear ratio, suitable for normal loads or normal speeds for the transmission. The rollers will move in response to the movement of the trunnions. Typically, the roller position is very sensitive to the trunnion position. A trunnion movement of as little as 0.030 to 0.050 inches (about 0.75 to 1.25 mm) may cause a relatively large change in the turns ratio of the input toroid to the output toroid, and thus input shaft to output shaft.

In FIG. 7, the transmission has shifted to a higher gearing position, in which the ratio of revolutions of the output toroid 12 and output shaft 12a to revolutions of the input toroid 11 and input shaft 11a is high. To cause this change, the trunnions 14 have again adjusted rollers 18, 19, such that one revolution of the input toroid 11 causes more than one revolution of the output toroid 12. This would be considered high gear, for driving the output shaft at a maximum speed and perhaps a minimum torque. Those having skill in the art will recognize that the ratios of the input to output toroids may be designed as desired. In the discussions below, the gear ratio will be discussed in terms of input turns to output turns. In some applications, "low" gear may be one turn of the input shaft for one turn of the output shaft (a 1:1 ratio), while in "high" gear, the input shaft may turn one revolution for four turns of the output shaft (a 1:4 ratio). In other applications, such as for very heavy loads, the ratios may vary from 4:1 at a low speed to 1:1 at a high speed.

A system using the dual axis magnetic field detector will include at least one magnet and sensing elements for detecting the magnetic field. FIGS. 3a and 3b show such a system, in which part of the system is mounted on the trunnion 14. As shown in FIGS. 3a-3b, a magnet carrier 50 atop the trunnion 14 mounts sector magnets 21 between radial ribs 57 and an inner annular rib 59. The magnetic field thus tends to be concentrated in the center portion of the magnet carrier 50, the center portion defined as the space within annular rib 59. As the piston 15 translates up and down to adjust the trunnion 14, the magnets 21 and the magnetic field created by the magnets will also translate. The magnetic field will be detected by the sensors 25, 27 mounted on the stationary support 26. In this embodiment, the plane of the rotational sensor 27 is preferably parallel to the horizontal axis of the magnet, and is preferably as co-planar as possible to the center of the magnetic field. The displacement sensor 25 is also mounted on the stationary support 26. Both sensors may be hall-effect sensors or other sensors suitable for detecting the angle and linear displacement of a magnetic field. For instance, a magnetoresistive sensor SS-13D012 from Mitsui Electric Co., Ltd., of Tokyo, Japan, is capable of converting a stroke of up to 12 mm with an output sensitivity of 320 mV/mm of stroke.

Figure 8:
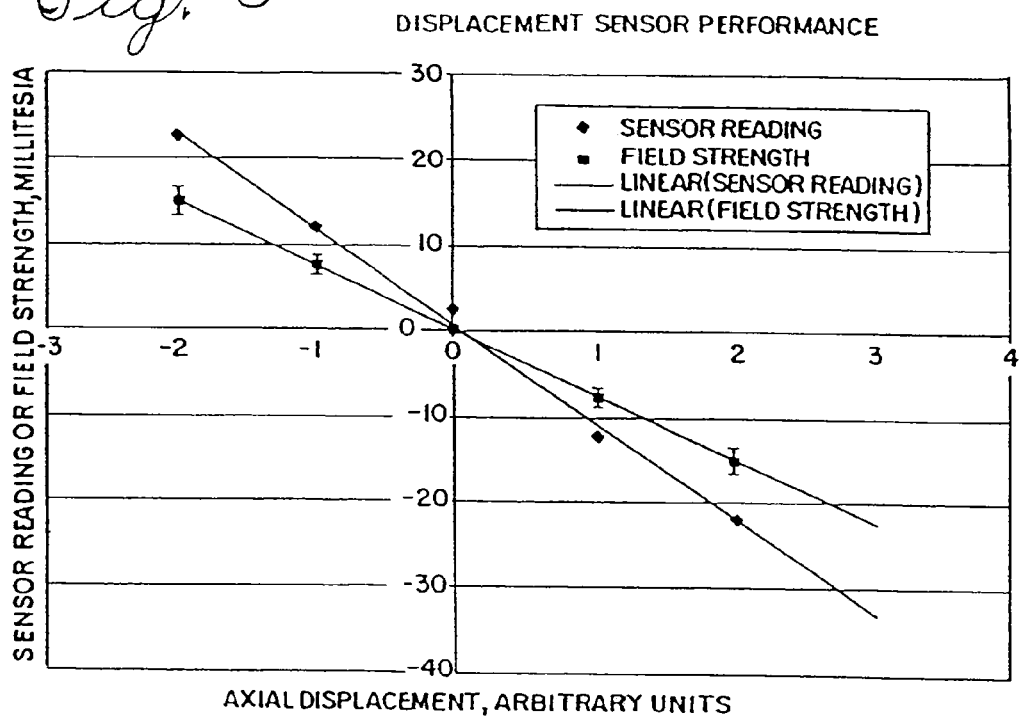
FIGS. 8-9 are graphs depicting sensor performance with ring-forming magnets.
Figure 9:
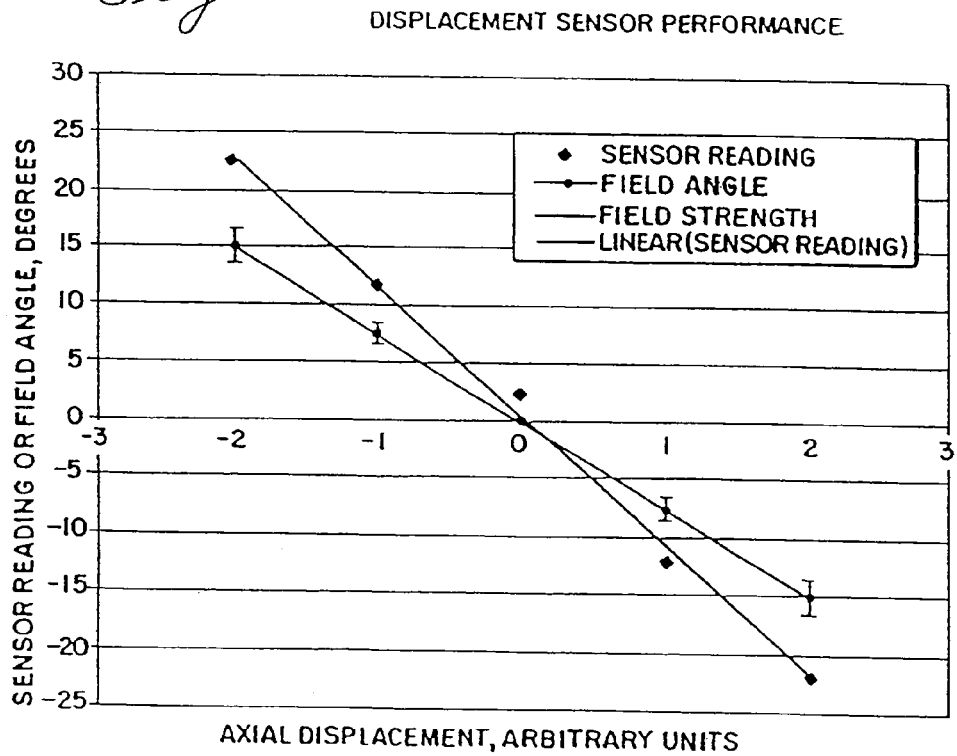

FIGS. 8-9 are graphs depicting sensor performance for a hall-effect sensor with ring-forming magnets that translate axially. FIG. 8 graphs field strength against axial displacement, the error bars depicting the maximum error in field strength in millitesla. FIG. 9 graphs the performance of the same sensor and magnet, this time displaying the variance of field angle with axial displacement. The errors and performance are comparable.

Figure 10:
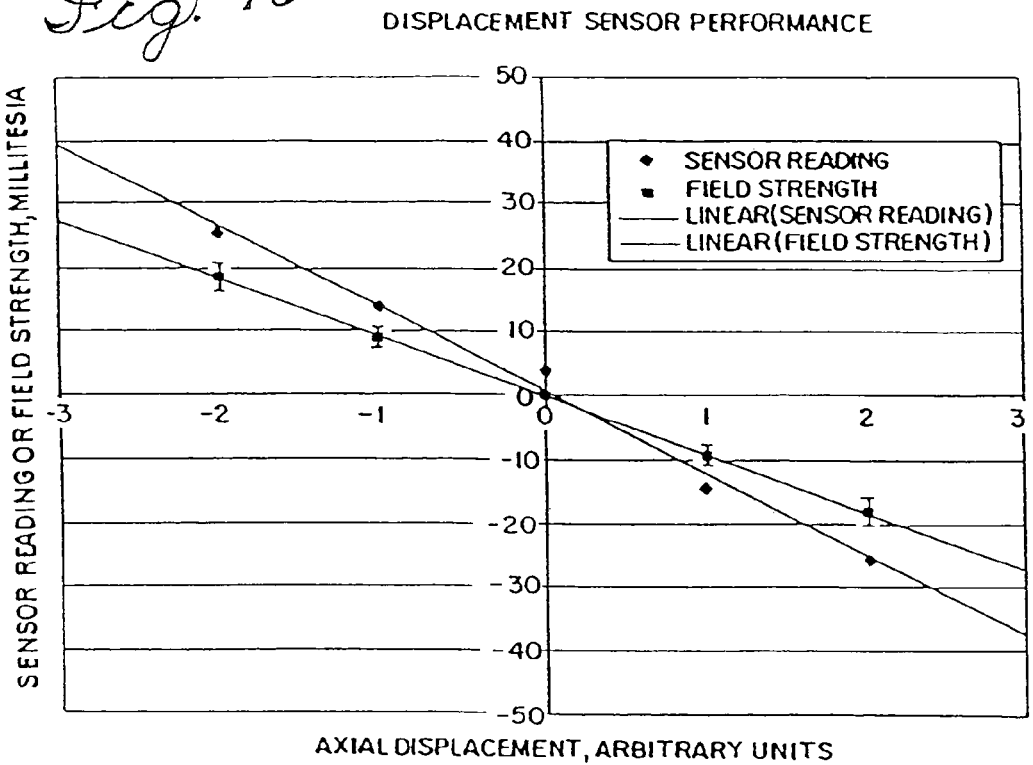
FIGS. 10-11 are graphs depicting sensor performance with sector magnets.
Figure 11:
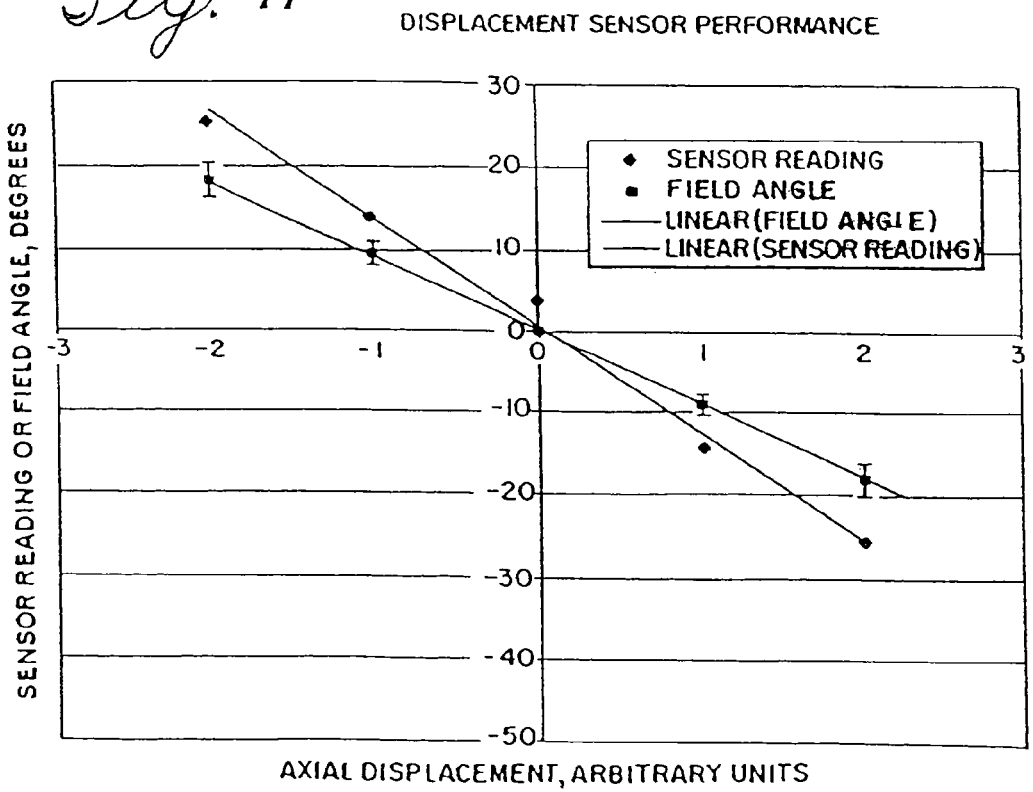

FIGS. 10-11 show the same information as for FIGS. 8-9, but for sensor performance with sector magnets. In. FIG. 10, sector magnets were placed on a device and the performance of hall-effect sensors was measured. Error bars on the measured field strength depict the precision of the sensor. FIG. 11 graphs the field angle measurements for the same sensor and sector magnets as FIG. 10. Performance for both field strength and field angles is similar. In the tests conducted to date, this sensor has better performance and less error at minimal displacement.

Figure 12:
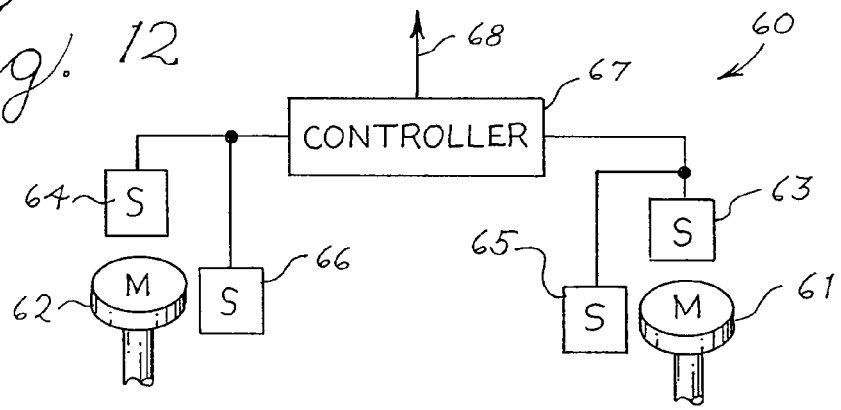
FIG. 12 is a schematic drawing of a system for detecting movement of two magnets in two axes each.

A continuously variable transmission will of course include two trunnions and rollers. Therefore, a detector system to control the transmission could require two dual axis magnetic field detectors, one for each trunnion and roller assembly. However, since the trunnions should be interconnected in usual practice, only one set of detectors will typically be required. Nevertheless a two set detector system is described hereinafter to demonstrate how a system with multiple detector sets could operate. The system will preferably also include a controller for receiving the signals of both detectors and sending the signals to the transmission controller. A system 60 for detecting movement of trunnions in a continuously variable transmission is shown in FIG. 12. The system 60 detects movement of magnetic fields generated by magnets 61, 62, each of which is attached to a trunnion from a continuously variable transmission (not shown).

A first magnetic field detector will include magnetic field sensors 63, 65, preferably one sensor for each axis of movement of magnet 61 as described above. Sensors 63, 65 will detect linear and rotary motion of the magnet 61 and the magnetic field emanating from the magnet 61 as the first trunnion translates or rotates. A second magnetic field detector includes magnetic field sensors 64, 66 for detecting movement of the magnet 62 as the second trunnion moves. Signals from the sensors are applied to a controller 67, which is preferably a microprocessor controller. The controller 67 processes the signals and reports the position of the sensors, and thus the trunnions, to a controller that is monitoring and controlling the transmission. As noted above, some sensors may themselves include a microprocessor controller. Of course, even though two sets of detectors and associated magnets are disclosed, a single detector set, more than two detector sets, or any number of magnets could be used.

Figure 13A:
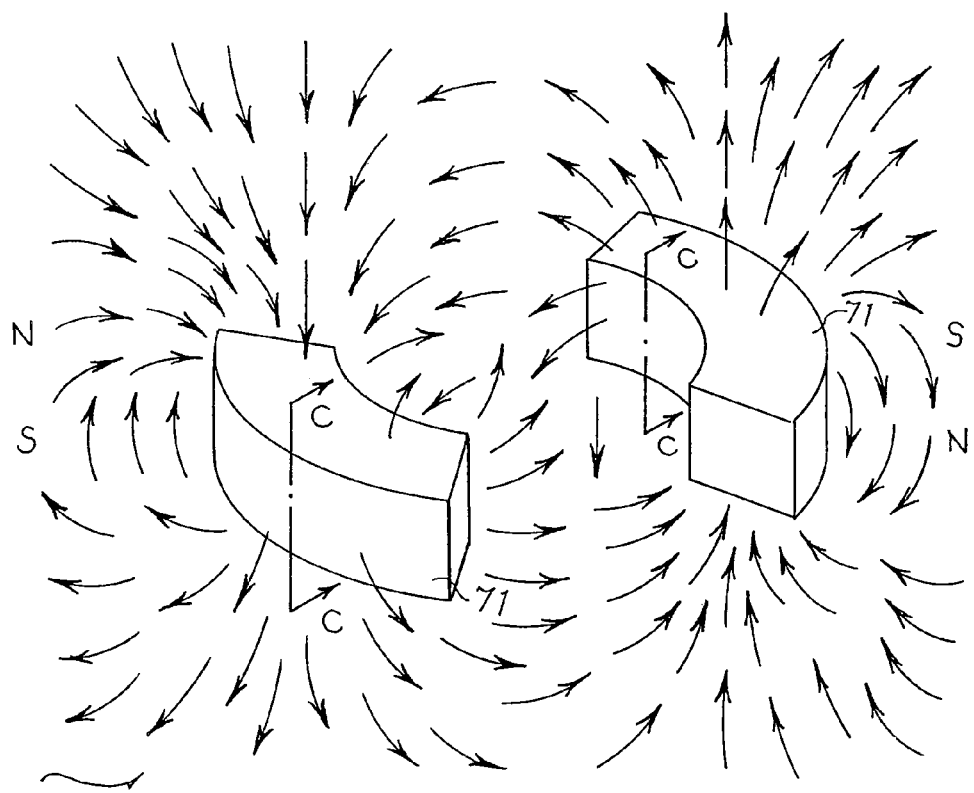
FIG. 13a is a perspective view of sector magnets and associated lines of force.
Figure 13B:
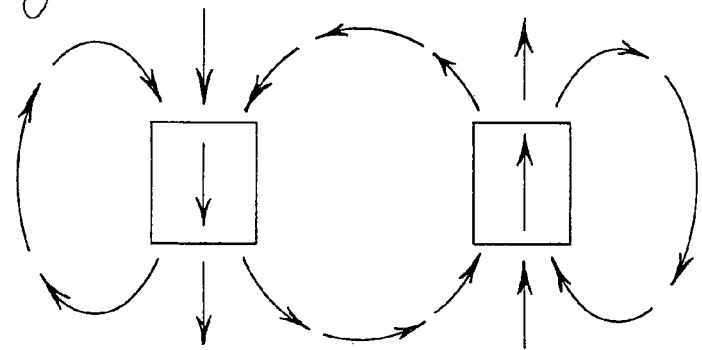
FIG. 13b is a cross-sectional view of the magnets of FIG. 13a, taken along a centerline "C" in the direction of the arrows at the end of this line.

Magnets preferred for use in the above-described detector system or for a system employing a single set of detectors are shown in FIG. 13a. In this embodiment, two sector magnets 71 are positioned as shown, with their poles oriented vertically and in opposite directions. This orientation increases the magnetic field on the outside of the magnets for sensing linear displacement. This orientation also ensures an adequate magnetic field above and on the inside area of the magnets, for sensing the displacement angle. The magnetic lines of force for the magnets of FIG. 13a are also shown in the associated cross-sectional view of FIG. 13b, taken along section lines C.

The disclosed dual axis magnetic field detector is very useful, and may have applications for detecting and controlling movement of one object or more than one object. It is therefore intended that the foregoing detailed description be regarded as illustrative rather than limiting, and that it be understood that it is the following claims, including all equivalents, that are intended to define the scope of this invention. For instance, capacitive or other proximity sensors could be adapted to detect the proximity of the magnet and the magnetic field, and could thus be used in place of the preferred hall-effect and magnetoresistive sensors. These other sensors might not, however, result in optimum performance of the claimed dual position detector.

What is claimed is:

1. A dual position detector, comprising:
a housing;
a first magnetic sensor and a second magnetic sensor apart from the first magnetic sensor for sensing a magnetic field, said sensors attached to the housing; and
at least one magnet for attaching to a movable object, wherein the first and second magnetic sensors are oriented for detecting motion of the at least one magnet in a linear axis of motion and a rotary axis of motion, wherein the at least one magnet comprises two magnets and north and south poles of the two magnets are oppositely oriented.

2. The dual position detector of claim 1 wherein a sensing face of the first magnetic sensor and a sensing face of the second magnetic sensor are oriented in a direction parallel to a magnetic field generated by the at least one magnet.

3. The dual position detector of claim 1 wherein the first and second magnetic sensors are hall-effect sensors or magnetoresistive sensors.

4. The dual position detector of claim 1, wherein the magnets have a shape for concentrating and shaping the magnetic field, the shape selected from the group consisting of sector magnets, separated sector magnets and magnets having an outer beveled surface.

5. The dual position detector of claim 1, wherein the magnets have an outer surface that is beveled from about 30° to about 60°.

6. The dual position detector claim 1, wherein at least one of the magnetic sensors functions by detecting the strength of the magnetic field.

7. The dual position detector of claim 1, wherein the first magnetic sensor is a magnetoresistive sensor that functions by detecting an angle of the magnetic field.

8. The dual position detector of claim 1, wherein the first magnetic sensor is oriented for detecting motion of the at least one magnet along a linear axis of motion and the second magnetic sensor is oriented for detecting motion of the at least one magnet along a rotary axis of motion.

9. The dual position detector of claim 1, further comprising a controller connected to the first and second magnetic sensors.

10. The dual position detector of claim 1, further comprising a second dual position detector and a controller connected to the dual position detector and the second dual position detector.

11. A dual position detector for a transmission, comprising:
a first magnetic sensor and a second magnetic sensor separate from the first sensor;
at least one magnet; and
a trunnion for supporting said at least one magnet for reciprocating movement;
wherein the first magnetic sensor is oriented for detecting motion of the at least one magnet along a linear axis of motion and the second magnetic sensor is oriented for detecting motion of the at least one magnet along a rotary axis of motion.

12. The dual position detector of claim 11, further comprising a second dual position detector and a controller operably connected to the dual position detector and the second dual position detector.

13. The dual position detector of claim 11, wherein the first and second magnetic sensors are hall-effect sensors.

14. The dual position detector of claim 11, wherein the first and second magnetic sensors are magnetoresistive sensors.

15. The dual position detector of claim 11, wherein a sensing face of the first magnetic sensor and a sensing face of the second magnetic sensor are oriented in a direction parallel to a magnetic field generated by the at least one magnet.

16. The dual position detector of claim 11, wherein the at least one magnet comprises two magnets and the two magnets are oppositely oriented.

17. A method of detecting movement of magnets in two axes using a dual axis magnetic field detector, the method comprising:
mounting two magnets on a movable object, wherein north and south poles of the two magnets are oppositely oriented;
mounting on a housing a first sensor and a second sensor apart from the first sensor for sensing a magnetic field from the magnets;
orienting the sensors or the magnets such that the magnetic field is parallel to a sensing face of at least the first or second sensor; and
detecting movement of the magnets with the first and second sensors, such that the first sensor detects movement of one magnet along a linear axis, and the second sensor detects movement of the other magnet along a rotary axis.

18. The method of claim 17, wherein the magnets are shaped to concentrate and orient the magnetic field.

19. The method of claim 17, further comprising sending a signal indicating a position of the magnets from the detector to a controller.

20. The method of claim 17, further comprising adjusting a speed of a transmission by using the movement of the magnets detected with the first and second sensors.

* * * * *